Oct. 14, 1952

D. B. KEIM 2,613,540

WIRE TUNING DRIVE

Filed June 15, 1951

Inventor:
Donald B. Keim - Deceased,
Arthur C. Kneibler - Administrator,
by Merton D. Morse
His Attorney.

Patented Oct. 14, 1952 2,613,540

UNITED STATES PATENT OFFICE 2,613,540

WIRE TUNING DRIVE

Donald B. Keim, deceased, late of Syracuse, N. Y., by Arthur C. Kneibler, administrator, Syracuse, N. Y., assignor to General Electric Company, a corporation of New York Application June 15, 1951, Serial No. 231,872

6 Claims. (Cl. 74—10.8)

Figure 1:
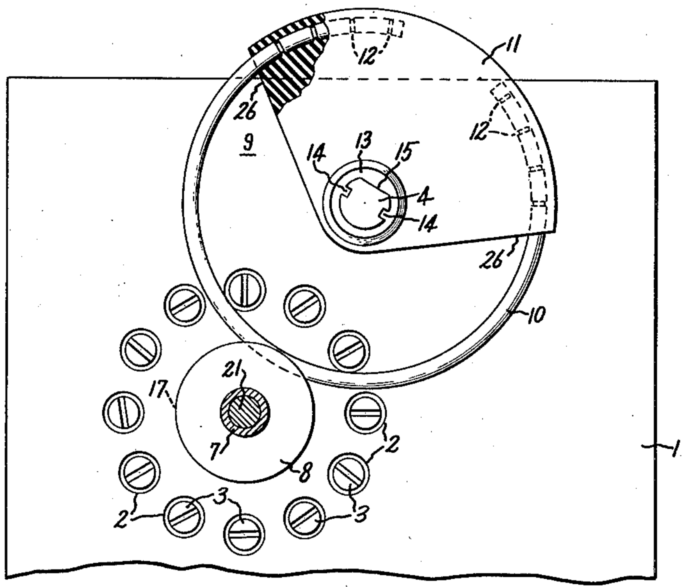

The invention relates to radio tuning drive mechanisms and more particularly to a wire tuning drive mechanism adapted for use with television broadcast receivers.

In many applications it is not desirable to connect a tuning condenser shaft directly to an actuating control knob. Thus, many tuning drive mechanisms incorporate a tuning condenser with means to turn the rotors at a much slower speed than the control knob. This results in more accurate control and is generally accomplished by means of friction drive pulley arrangements in which a large driven wheel may be secured to a tuning shaft and in peripheral frictional contact with a small pulley turned by a suitable control knob. Other tuning drive mechanisms employ a drive cord wrapped around the condenser tuning shaft and drive shaft which is turned by a similar control knob. However, these latter cord drive mechanisms have proved unsatisfactory for high frequency applications and television receiver tuning arrangements where slippage between the driving and driven member and absence of direct positive drive cause undesirable operation including objectionable detuning.

Presently manufactured television receivers generally incorporate a so-called "head end" section which houses among other elements the oscillator fine-tuning condenser connected through a suitable drive mechanism to a control knob as well as variable trimmer condensers for each channel. It has been found desirable to mount the trimmer condensers so that they may be accessible for servicing and aligning from the front panel of such a section through which the tuning condenser drive shaft also extends. The tuning and trimmer condensers are generally located near one another. It will be apparent then that a tuning drive mechanism should be constructed so as not to obstruct the trimmer controls under varying tuning condenser positions. The drive mechanisms heretofore employed are not well adapted to this application.

It is therefore one object of the invention to provide a tuning drive mechanism in which a wire ring-like member, unsupported over a large portion of its circumference, provides a direct positive connection between the tuning shaft and the control shaft.

It is another object of the invention to provide a tuning drive arrangement which permits adjustment of internal control elements, located behind a television chassis panel, despite the proximity of these elements to the tuning drive mechanism.

Another object of the invention is to provide a friction tuning drive mechanism for a television broadcast receiver in which the tuning condenser shaft is driven by an incomplete wire ring-like member unsupported over a large portion of its circumference which permits tuning and aligning tools to be inserted inside the wire ring to adjust other elements of the receiver.

It is a further object of the invention to provide a tuning drive mechanism having a wire ring-like drive member in which the insulating support for the wire acts as an automatic stop member preventing damage to the mechanism when improperly operated.

Figure 2:
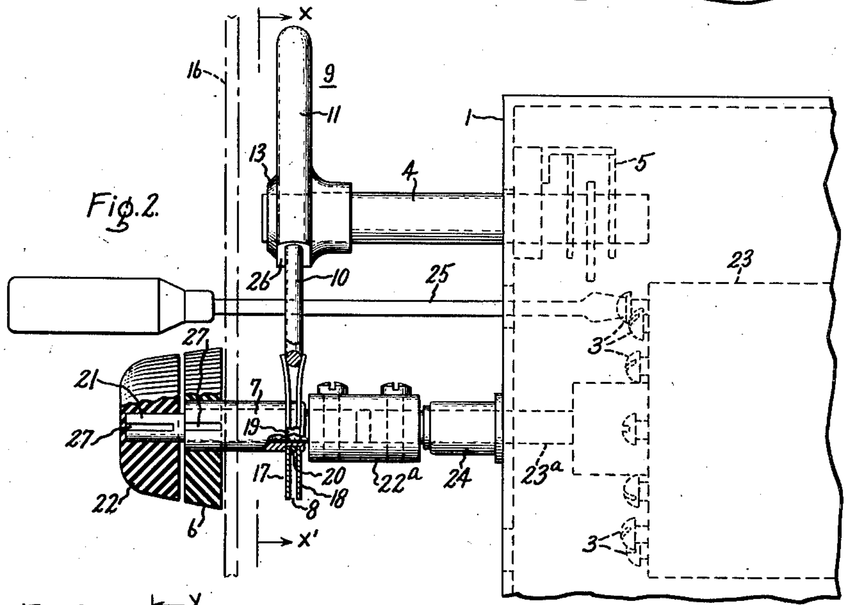
Figure 3:
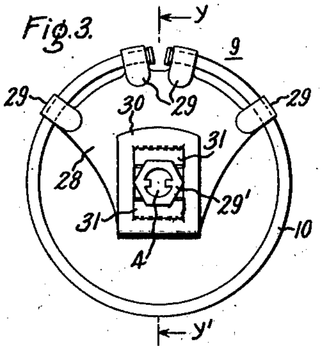
Figure 4:
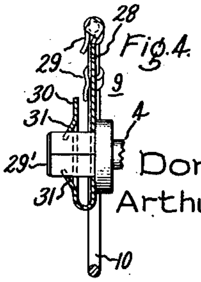

For additional objects and advantages and for a better understanding of the invention, attention is now directed to the following description and accompanying drawings. The features of the invention which are believed to be novel are particularly pointed out in the appended claims. In the drawings, Fig. 1 is a front elevation of the tuning drive mechanism and panel as might be viewed along the line $x—x'$ of Fig. 2, Fig. 2 is a side elevation, partly in section, of the tuning drive mechanism and panel, Fig. 3 is a front elevation of one modification of the wire ring-like drive member shown in Fig. 1, and Fig. 4 is a side elevational view, partially in section, taken along the line $y—y'$ of Fig. 3.

As heretofore stated, the improved drive mechanism has particular application to a television broadcast receiver. Therefore, in Fig. 1, there is shown a chassis panel member 1 of such a receiver. This panel has a plurality of circularly arranged spaced-apart control apertures 2, through which certain system control elements may be reached for adjustment and servicing purposes. In this particular case, they comprise trimmer condenser screws 3 located in circular arrangement and corresponding in number to the number of channels received by the television set.

In this embodiment, as in others referred to heretofore, the fine-tuning condenser is located adjacent the trimmer condensers. There is shown in this figure a tuning condenser shaft 4 to which there is connected a variable condenser assembly 5 shown in outline form in Fig. 2. The shaft 4 is suitably journaled in the panel member and is driven by means of a knob 6 (shown in Fig. 2) secured to a concentric sleeve or shaft member 7 through a drive mechanism including a friction disc member 8 carried by the sleeve 7 and a wire ring-like drive member 9 connected to the shaft 4. The wire ring-like drive member 9 comprises the incomplete wire ring 10, the ends of which are secured within an insulating molded-plastic sectorial member 11. In order to fasten the ring 10 securely within the sectorial member 11, annular indentations 12 are provided at the ends of the ring. The sectorial supporting member 11, which is of course thicker than the diameter of the wire, fits on the tuning shaft 4 and is held in place by means of a flanged hub portion 13. This hub portion 13 includes keys 14 which fit into corresponding slots in the tuning shaft and a flat portion 15 fitting a corresponding flat portion of the tuning shaft. The wire ring-like member frictionally engages the disc member 8 whereby movement of the control shaft 7 may be transmitted to the tuning shaft 4.

It will be seen that with this arrangement none of the trimmer screws 3 are hidden by the wire ring 9, and further that the tuning shaft may be rotated within feasible limits without rendering the controls 3 inaccessible.

It should be specifically pointed out that the tuning shaft is insulated from the ring by the sectorial member 11, thereby minimizing oscillator radiation and static voltages which might be due to metal contact between the metal friction disc 8 and the wire ring 10 or between the wire ring 10 and the tuning shaft 4. Also, in the embodiment greater manufacturing assembly tolerances are permitted since the unsupported portion of the ring 10 is slightly flexible allowing for misalignment of the ring 10 and the disc member 8.

There is shown in Fig. 2 a side view of the improved wire drive mechanism including a portion of the television cabinet 16, shown in outline, and the external control knobs. The tuning control knob 6 is fastened to the control shaft or sleeve 7 and drives the wire ring-like member 9 through the friction disc member 8 secured thereto. The friction disc member 8 comprises metallic discs 17 and 18 which are staked to the driving sleeve in its annular slot 19 and spaced apart by an annular spacer 20 which is thinner than the diameter of the wire ring. It will be evident that with this arrangement there is provided smooth metal to metal drive between the spring disc sheaths 17 and 18 and the interfitting wire member 10, and further that the wire member 10 is gripped between these discs at its outer peripheral surfaces. There is shown the two metallic discs as illustrating a preferred embodiment of the invention and it will be apparent that other friction drive means may be employed, if desired, to drive the wire ring-like members.

The tuning shaft or sleeve 7 is concentric with another shaft 21 to which a selector knob 22 is attached. This latter shaft functions to change the necessary circuit connections within the chassis for the different channel settings. For isolation purposes, this selector shaft 21 is connected to an insulating coupling 22*a* which in turn connects to the channel selecting means 23 by a shaft 23*a* supported in a bearing member 24.

As heretofore mentioned, the position of the front cabinet 16 is shown in outline. However, it will be appreciated that the receiver chassis, including the panel 1 and drive mechanism, are removed from the cabinet when the trimmer screws are to be adjusted. There is shown in this figure one means for adjusting these controls comprising the screwdriver 25. It is to be especially noted that during the adjustment of certain of the trimmer controls that the screwdriver extends through the wire ring-like member and the panel.

It will be evident from Figs. 1 and 2 that the driving mechanism provides an inherent stop so that even though the front control knob 6 is continuously rotated in one direction, there will be no damage to the fine tuning condenser 5 since the shoulder 26 on the plastic support member 11 engages the disc drive members and prevents further rotation of the tuning shaft. The sectorial member 11 occupies approximately 120° within the total area of the drive member 9 so that the tuning condenser may be rotated, in this particular application, as much as 240°.

It may be noted that the two knobs 22 and 6 secured respectively to the selector shaft 21 and the control drive shaft or sleeve 7 are similar to the hub portion 13 of the sectorial member 11 in that they both have key portions fitting into corresponding slots 27 at the ends of their respective shafts.

In Figs. 3 and 4 there is shown a modification of the wire ring-like drive member shown in Fig. 1 in which the insulating plastic sectorial member 14 is replaced with a metallic member 28 having spring ears 29 which grip the wire member 10 over only a small portion of its circumference. The member 28 is secured to the shaft by means of a hexagonal insulating cap or hub member 29′. This cap or hub portion 29′ fits on the end of the shaft 4 in the same manner as the hub 13 shown in Fig. 1 and is secured to the metallic wire support member by means of the self locking clip 30. Referring to Fig. 4, which is a section along the line $y—y'$ of Fig. 3, there is shown the hexagonal hub or cap 29 secured to the clip 30 by means of the oppositely disposed prong members 31. Here too, insulation is provided between the wire 10 and the tuning shaft by means of the insulating hub or cap 29′.

It will thus be apparent that there is provided tuning drive mechanism which is designed especially for use in those television broadcast applications in which it is desired to make receiver adjustments behind a chassis panel adjacent to the fine tuning condenser and in which a wire ring-like tuning shaft drive member is employed through which external adjusting apparatus may be inserted to reach control elements behind the panel. There is provided a tuning drive mechanism using an incomplete wire loop which is unsupported over a large portion of its circumference and driven by friction discs whereby suitable adjusting means may be inserted within the wire ring as necessary for adjusting other elements of the system.

While a specific embodiment of the invention has been shown and described and certain modifications therein have been suggested, it will of course be understood that various other modifications may be made without departing from the principles of the invention. The appended claims are, therefore intended to cover any such modification within the true spirit and scope of the invention.

What is claimed as new and desired to be secured by United States Letters Patent is:

1. A tuning drive mechanism comprising a panel, two parallel shafts journaled to said panel, means interconnecting said shafts for relative rotation with respect to each other comprising a disc-shaped member secured to one shaft and a ring-like member secured to the other shaft, said ring-like member comprising a relatively-resilient, arcuate, wire portion in peripheral engagement with said disc-shaped member and a relatively-rigid sectorial portion supporting the ends of said wire portion and means securing said sectorial portion to said other shaft, said wire portion being capable of slight radial deformation as necessary to compensate for any slight misalignment between the contacting surfaces of said two members.

2. A tuning drive mechanism comprising a panel, first and second parallel shafts, means to journal said first shaft within said panel, means rotatably supporting said second shaft, means to connect said shafts for relative rotation with respect to each other comprising a disc-shaped member secured to one shaft and a ring-like member secured to the other shaft, said disc-shaped member comprising a pair of resiliently-mounted, spaced, metal discs, said ring-like member comprising a relatively-resilient, arcuate, wire portion arranged to be frictionally gripped between said discs and a relatively-rigid sectorial portion supporting the ends of said wire portion and means securing said sectorial portion to said other shaft, said wire portion being capable of slight radial deformation as necessary to compensate for any slight misalignment between the contacting surfaces of said two members.

3. A tuning drive mechanism comprising a panel, first and second parallel shafts, means to journal said first shaft within said panel, means to rotatably support said second shaft, means to connect said shafts for relative rotation with respect to each other comprising a disc-shaped member secured to one shaft and a ring-like member secured to the other shaft, said ring-like member comprising an arcuate wire portion in peripheral engagement with said disc-shaped member and a sectorial portion having means securing the ends of said arcuate wire portion thereto and including insulating means securing said sectorial portion to said other shaft.

4. A tuning drive mechanism comprising a panel having a plurality of control apertures, a tuning shaft journaled to said panel adjacent said apertures, a control shaft rotatably mounted parallel to said tuning shaft, means interconnecting said shafts for relative rotation with respect to each other comprising a disc-shaped member secured to said control shaft and a ring-like member secured to said tuning shaft, said ring-like member comprising an arcuate wire portion in peripheral contact with said disc-shaped member and having end portions secured within a sectorial support portion having an insulating central hub portion fitting on the end of said tuning shaft.

5. A tuning drive mechanism for television receivers comprising a panel having a plurality of control apertures, a tuning shaft journaled to said panel adjacent said apertures, a control shaft rotatably mounted parallel to said tuning shaft, means interconnecting said shafts for relative rotation with respect to each other comprising a disc-shaped member secured to said control shaft in frictional engagement with a ring-like member secured to said tuning shaft, said disc-shaped member comprising a pair of metallic discs, said ring-like member comprising an arcuate wire portion in contact with said disc member between said pair of metallic discs and having end portions secured within an insulating sectorial support portion having a central hub portion fitting on the end of said tuning shaft.

6. A tuning drive mechanism for television receivers comprising a chassis panel, a tuning condenser drive shaft journaled to said panel, a control shaft mounted for rotation parallel to said tuning shaft, means to rotate said control shaft, means interconnecting said tuning and control shafts for relative rotation with respect to each other, said means comprising a disc member secured to said control shaft and in frictional contact with a wire ring-like member secured to said tuning shaft, said wire ring-like member comprising an incomplete wire ring portion in contact with said disc member and supported by a sectorial insulating portion having a central hub portion fitting on said tuning shaft whereby external adjusting apparatus may be inserted inside said wire ring-like member and chassis panel.

ARTHUR C. KNEIBLER,
*Administrator of the Estate of Donald B. Keim, Deceased.*

REFERENCES CITED

The following references are of record in the file of this patent:

UNITED STATES PATENTS

| Number | Name | Date |
|---|---|---|
| 1,688,313 | Pacent | Oct. 16, 1928 |
| 1,928,310 | De Jur | Sept. 26, 1933 |